United States Patent
Hsieh et al.

(10) Patent No.: US 11,996,453 B2
(45) Date of Patent: May 28, 2024

(54) INTRODUCING FLUORINE TO GATE AFTER WORK FUNCTION METAL DEPOSITION

(71) Applicant: Taiwan Semiconductor Manufacturing Company, Ltd., Hsinchu (TW)

(72) Inventors: Bo-Wen Hsieh, Miaoli County (TW); Pei Ying Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 355 days.

(21) Appl. No.: 17/459,449

(22) Filed: Aug. 27, 2021

(65) Prior Publication Data
US 2023/0068458 A1 Mar. 2, 2023

(51) Int. Cl.
*H01L 29/40* (2006.01)
*H01L 29/423* (2006.01)
*H01L 29/49* (2006.01)
*H01L 29/78* (2006.01)

(52) U.S. Cl.
CPC ...... *H01L 29/401* (2013.01); *H01L 29/42392* (2013.01); *H01L 29/4966* (2013.01); *H01L 29/785* (2013.01)

(58) Field of Classification Search
CPC ............. H01L 29/401; H01L 29/42392; H01L 29/4966; H01L 29/785; H01L 29/4958; H01L 29/78696; H01L 29/0673; H01L 29/66439; H01L 29/66795
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,487,378 B2 | 7/2013 | Goto et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,860,148 B2 | 10/2014 | Hu et al. | |
| 8,887,106 B2 | 11/2014 | Ho et al. | |
| 2013/0113053 A1* | 5/2013 | Lin ................. | H01L 21/823842 257/411 |

(Continued)

*Primary Examiner* — Changhyun Yi
(74) *Attorney, Agent, or Firm* — Haynes and Boone, LLP

(57) ABSTRACT

A gate dielectric structure is formed over a channel structure. One or more work function (WF) metal layers of a metal gate are formed over the gate dielectric structure. The one or more WF metal layers are treated with a fluorine-containing material. One or more processes are performed to cause fluorine from the fluorine-containing material to diffuse at least partially into the gate dielectric structure.

20 Claims, 11 Drawing Sheets

(56) References Cited

U.S. PATENT DOCUMENTS

| | | |
|---|---|---|
| 2014/0001574 A1 | 1/2014 | Chen et al. |
| 2014/0110755 A1 | 4/2014 | Colinge |
| 2014/0151812 A1 | 6/2014 | Liaw |
| 2014/0282326 A1 | 9/2014 | Chen et al. |
| 2019/0096681 A1* | 3/2019 | Wei ................... H01L 21/32134 |
| 2020/0083221 A1* | 3/2020 | Ando ................ H01L 29/78696 |

* cited by examiner

INTRODUCING FLUORINE TO GATE AFTER WORK FUNCTION METAL DEPOSITION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the size of the gate of a transistor continues to get smaller, imperfections in the gate, such as in a gate dielectric, may lead to gate leakage problems. Gate leakage may result in transistor device degradations or even failures.

Therefore, although existing semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1B:
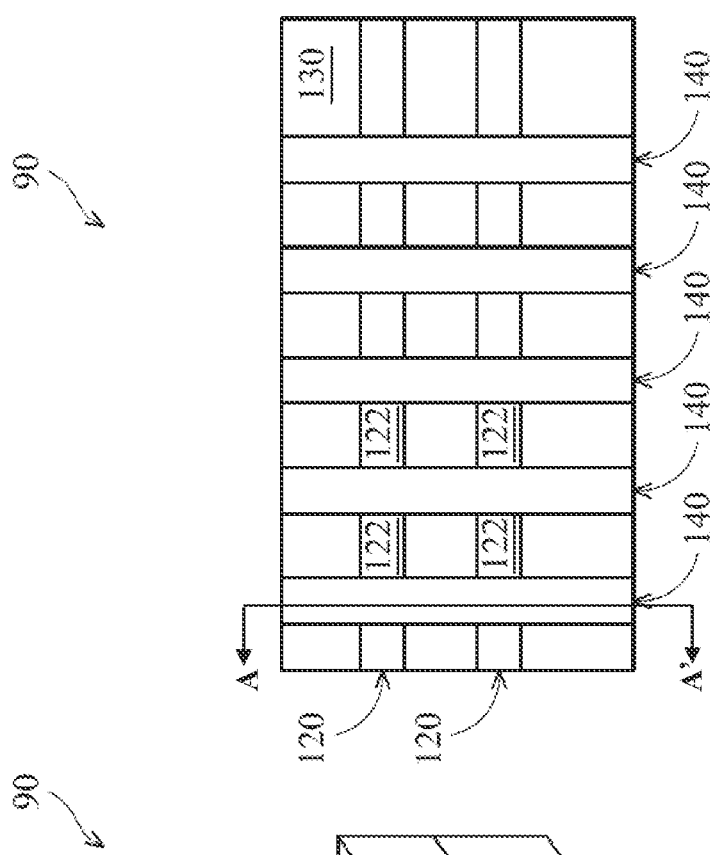
FIG. 1B illustrates a top view of a FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, which may be fabricated using field-effect transistors (FETs) such as three-dimensional fin-line FETs (FinFETs) or multi-channel gate-all-around (GAA) devices. FinFET devices have semiconductor fin structures that protrude vertically out of a substrate. The fin structures are active regions, from which source/drain regions and/or channel regions are formed. The gate structures partially wrap around the fin structures. GAA devices have multiple elongated nano-structure channels that may be implemented as nano-tubes, nano-sheets, or nanowires. In recent years, FinFET devices and GAA devices have gained popularity due to their enhanced performance compared to conventional planar transistors. However, as semiconductor device sizes continue to get scaled down, the imperfections within FinFET or GAA devices may lead to potential problems.

In more detail, modern FinFET and/or GAA device fabrication may involve forming a high-k metal gate (HKMG) structure, which contains a high-k gate dielectric (with a dielectric constant greater than that of silicon oxide) and a metal gate electrode. The high-k dielectric (e.g., hafnium oxide) is not a perfect crystal and may have grains that are amorphous. These amorphous grains may have traps/defects and/or experience bonding issues, which could lead to potential reliability-related issues. For example, the amorphous grains may cause the high-k dielectric to leak current, which is undesirable. Such a problem may be exacerbated over the course of a lifetime of a transistor device, that is, the current leakage may get worse as the transistor ages. Eventually, the transistor performance may be noticeably degraded, and failures may occur as well.

To address the problem discussed above, the present disclosure introduces fluorine to the high-k dielectric using one or more fluorine treatment processes and energy boosting processes. Specifically, the present disclosure introduces fluorine to a FinFET device or a GAA device after one or more work function (WF) metal layers has been deposited onto the high-k dielectric, rather than introducing fluorine to the high-k dielectric directly right after the formation of the high-k dielectric. Such a unique fabrication process flow entails certain benefits. For example, the fluorine introduced to the high-k dielectric will help plug the traps or defects of the amorphous grains of the high-k dielectric, thereby reducing potential current leakage problems. The order or sequence in which the fluorine introduction occurs according to the present disclosure is also beneficial. Had the fluorine been introduced to the high-k dielectric material directly (i.e., before the WF metal is deposited on the high-k dielectric), the fluorine bonding with the high-k dielectric material may be weak. When it experiences an energy boost, for example during a thermal process with relatively high temperatures of a few hundred degrees Celsius, the fluorine bonds may break, and the fluorine may escape from the high-k dielectric material as a result. By introducing fluorine to the gate of the transistor after the formation of the WF metal, the present disclosure improves the quality of the fluorine bonds with the gate dielectric material and ensures that the fluorine will not be able to escape the gate even when subsequent fabrication processes (e.g., thermal processes) provide an energy boost. Consequently, the FinFET or GAA device fabricated according to the present disclosure has improved device performance and better reliability compared to conventional devices.

Figure 1A:
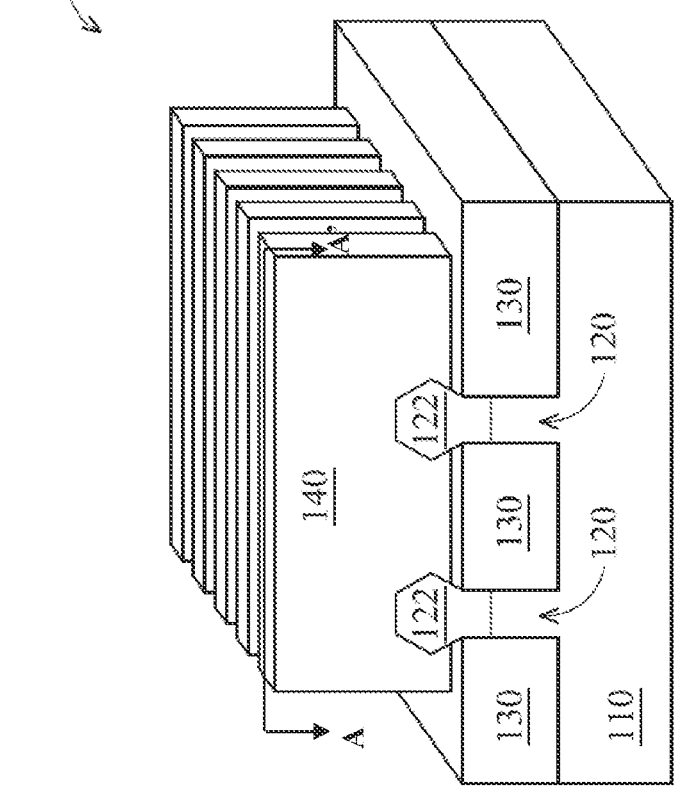
FIG. 1A illustrates a three-dimensional perspective view of a FinFET device.
Figure 1C:
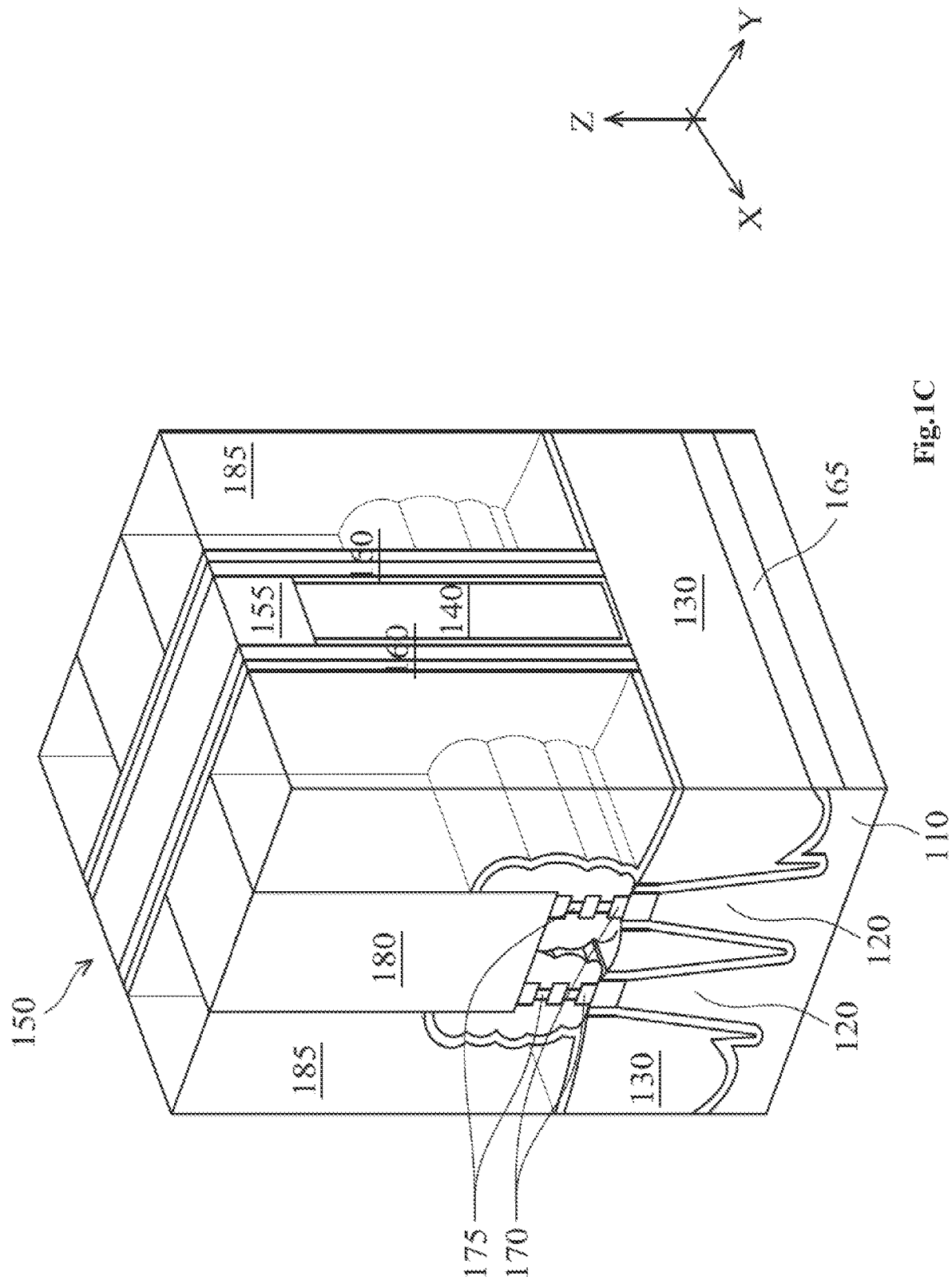
FIG. 1C illustrates a three-dimensional perspective view of a multi-channel gate-all-around (GAA) device.
Figure 7A:
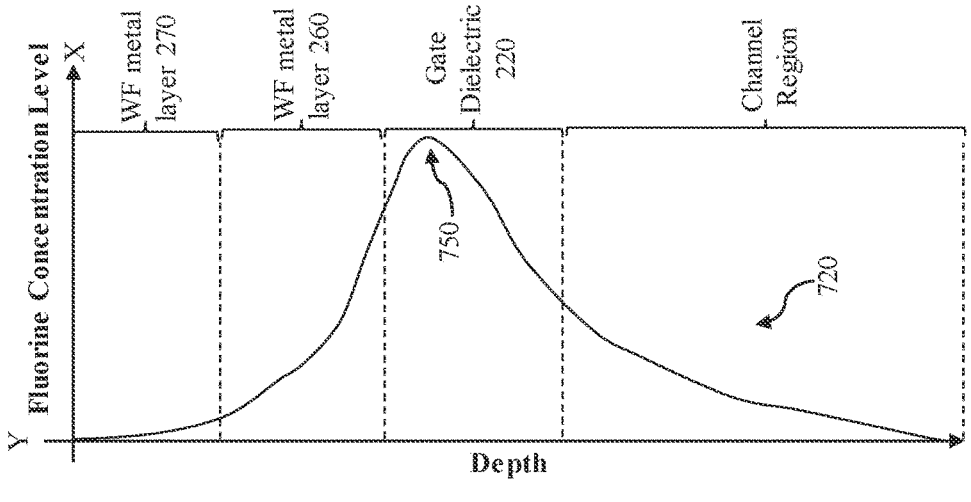
FIGS. 7A-7C illustrate graphs showing how the fluorine concentration levels within an IC device vary versus depth at different stages of fabrication.
Figure 7B:
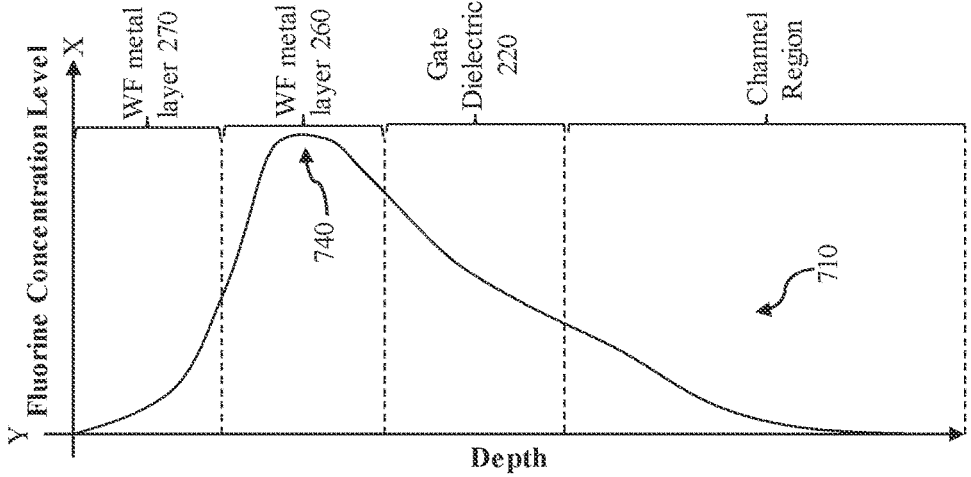
Figure 7C:
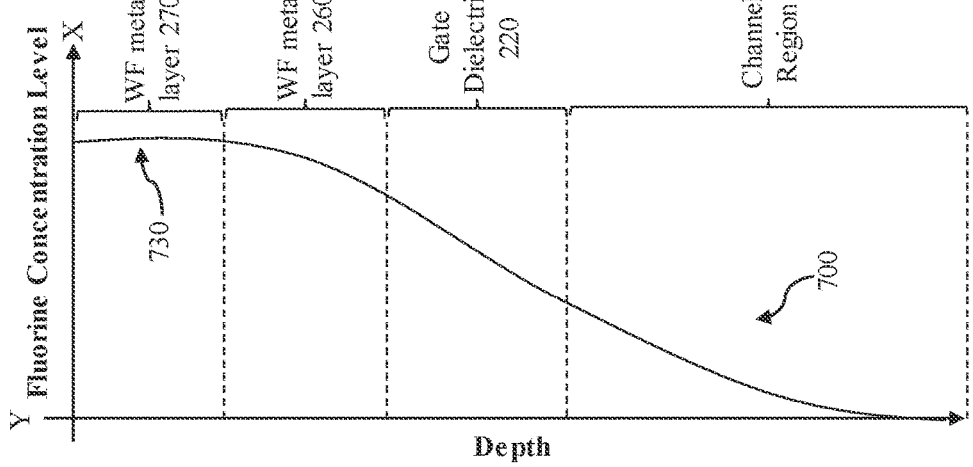
Figure 8:
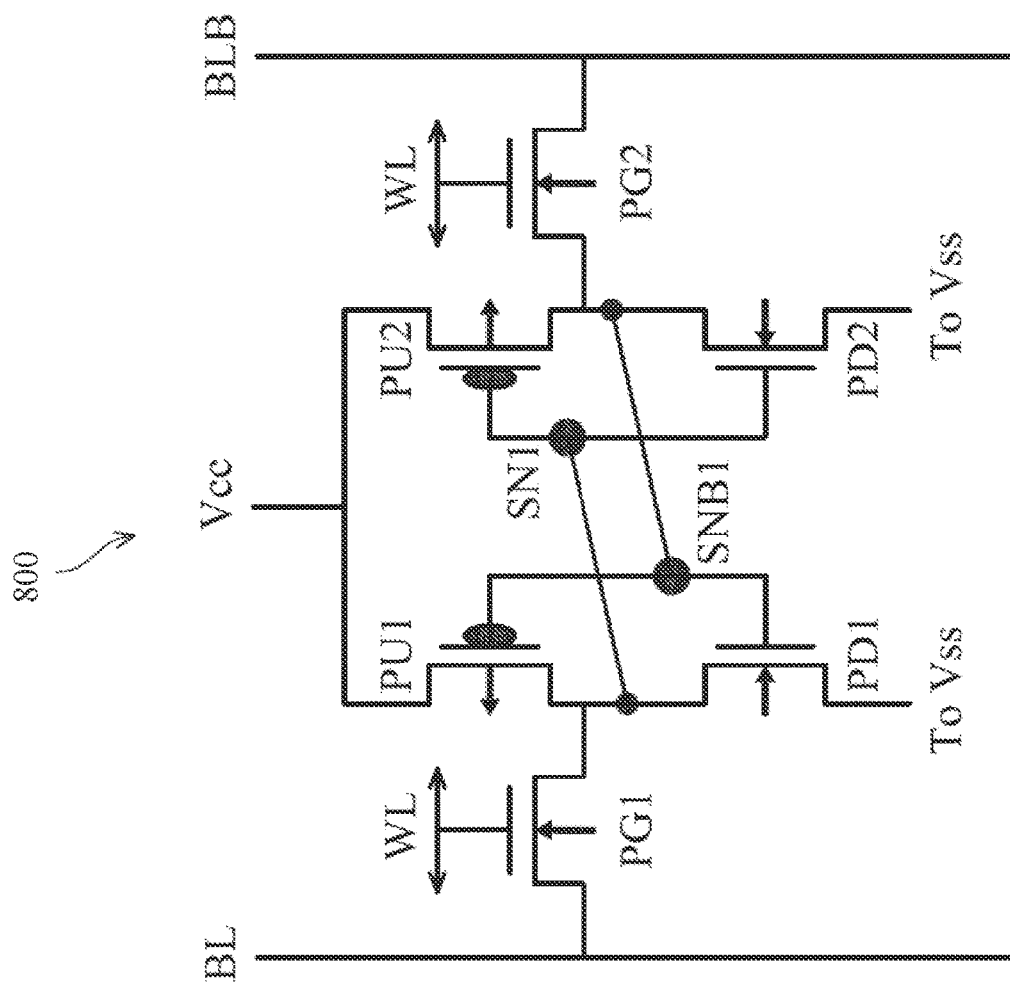
FIG. 8 illustrates a Static Random Access Memory (SRAM) cell according to an embodiment of the present disclosure.
Figure 9:
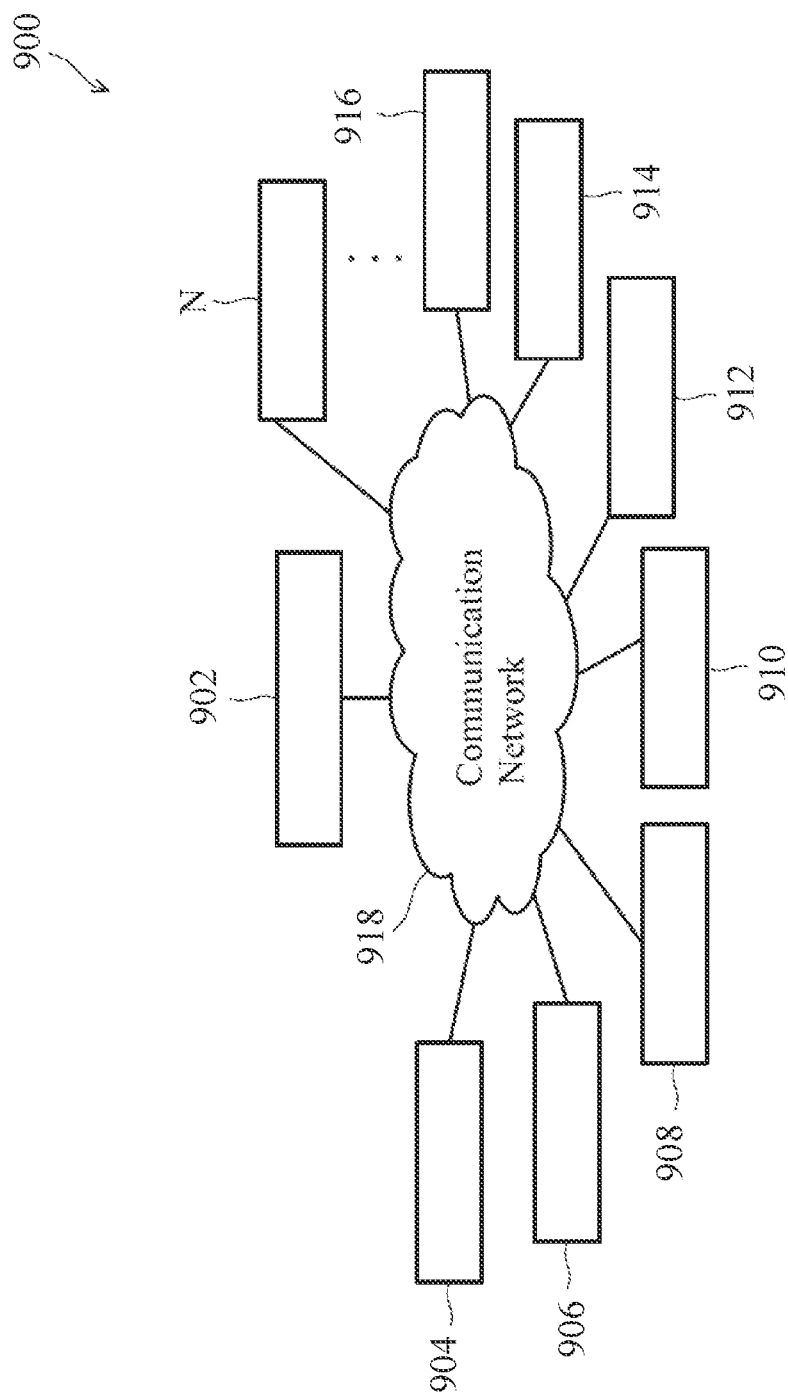
FIG. 9 illustrates an integrated circuit fabrication system according to an embodiment of the present disclosure.
Figure 10:
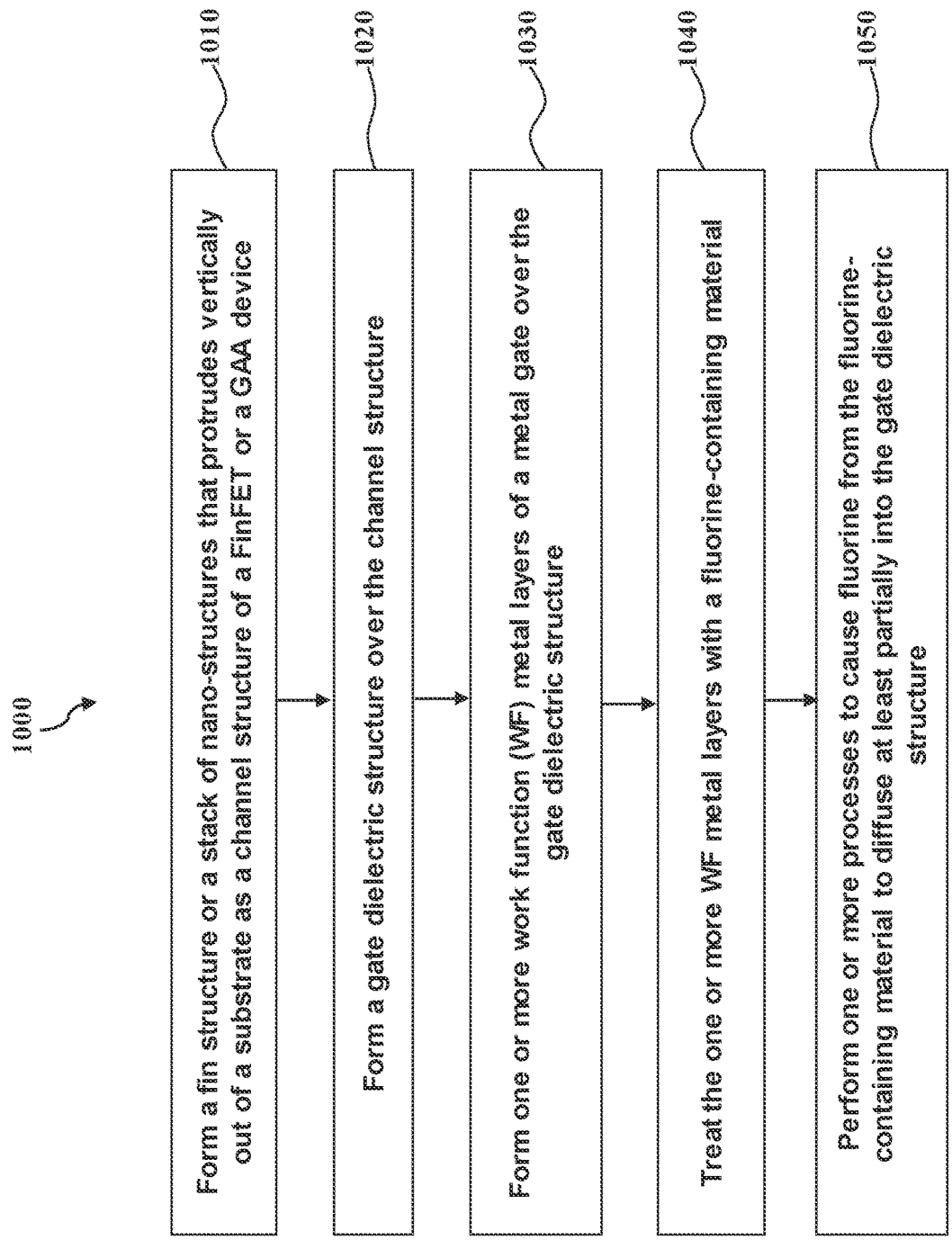
FIG. 10 is a flowchart illustrating a method of fabricating a semiconductor device according to various aspects of the present disclosure.

The various aspects of the present disclosure are now discussed below with reference to FIGS. 1A-1C and 2-10. In more detail, FIGS. 1A-B illustrate an example FinFET device, and FIG. 1C illustrates an example GAA device. FIGS. 2-6 illustrate a portion of a transistor (which could be a FinFET device or a GAA device) at different stages of fabrication. FIGS. 7A-7C illustrate diagrams of fluorine distribution versus depth within an IC device at different stages of fabrication. FIG. 8 illustrates a memory circuit as an example IC application implemented using IC devices fabricated according to the various aspects of the present disclosure. FIG. 9 illustrates a semiconductor fabrication system. FIG. 10 illustrates a flowchart of a method of introducing fluorine to an IC device according to various aspects of the present disclosure.

Referring now to FIGS. 1A and 1B, a three-dimensional perspective view and a top view of a portion of an Integrated Circuit (IC) device 90 are illustrated, respectively. The IC device 90 is implemented using FinFETs. As shown in FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-6 illustrate the cross-sectional side views of an IC device 200 at different stages of fabrication. FIGS. 2-14 correspond to the cross-sectional cuts taken along a Y-direction, for example along the cutline A-A' in FIGS. 1A and 1B. As such, FIGS. 2-6 may be referred to as Y-cut Figures.

Figure 2:
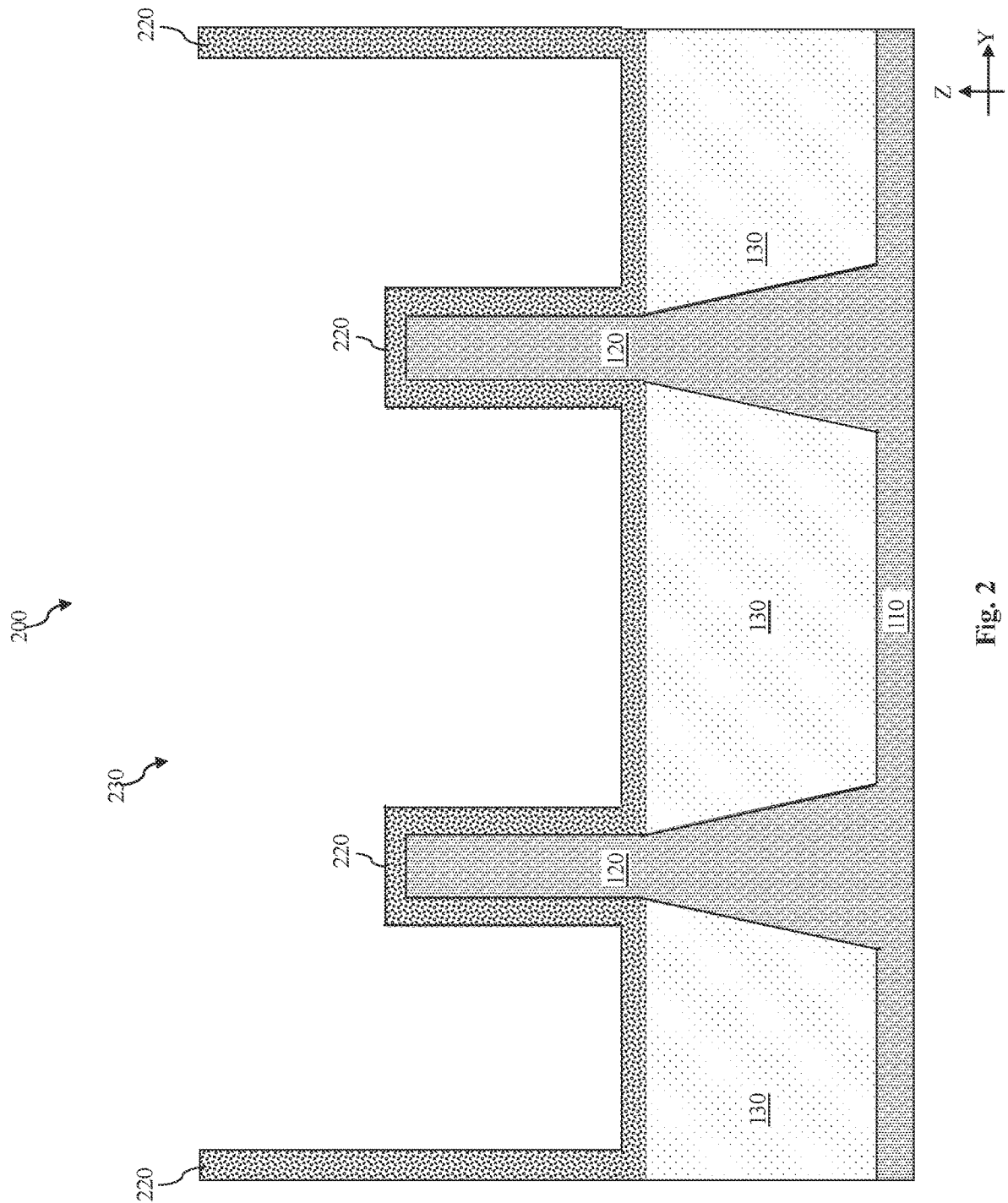
FIGS. 2-6 illustrate a series of cross-sectional views of a semiconductor device at various stages of fabrication according to embodiments of the present disclosure.

Referring to FIG. 2, the IC device 200 includes a substrate 110 discussed above with reference to FIGS. 1A-1C, for example a silicon substrate. A plurality of active regions may be formed on the substrate 110. For example, the active regions may include the fin structures 120 discussed above with reference to FIGS. 1A-1B, which protrude vertically (in the Z-direction) out of the substrate 110. In some embodiments, the fin structures 120 are formed by patterning the substrate 110. The fin structures 120 each extend laterally in the X-direction. The bottom portions of the fin structures 120 are separated from one another in the Y-direction by the isolation structures 130, which is also discussed above with reference to FIGS. 1A-1B. In the illustrated embodiment, the isolation structures 130 include shallow trench isolation (STI) structures.

Still referring to FIG. 2, the IC device 200 includes a gate dielectric 220. The gate dielectric 220 may include a high-k dielectric material, which to a dielectric material having a dielectric constant that is greater than a dielectric constant of silicon oxide (e.g., about 3.9). Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof.

In some embodiments, the gate dielectric 220 is formed as a part of a gate replacement process, in which a dummy gate structure is replaced by a high-k metal gate (HKMG) structure. In that regard, a dummy gate structure may initially be formed, where the dummy gate structure includes a dummy gate dielectric (e.g., a silicon oxide gate dielectric) and a dummy polysilicon gate electrode. After the formation of source/drain regions, the dummy gate structure is removed, thereby forming an opening 230 (or recess). The HKMG structure is then formed in the opening 230 to replace the removed dummy gate structure. The gate dielectric 220 herein may be formed to replace the dummy gate dielectric as a part of such a gate replacement process, and a metal gate electrode will be formed in subsequent processes to replace the dummy gate electrode. In other embodiments, however, the gate dielectric 220 may be formed before the dummy gate electrode, and as such it needs no replacement. In other words, the dummy gate structure may include a dummy gate electrode but not a dummy gate dielectric, since the gate dielectric 220 has already been formed. The dummy gate electrode is formed on the gate dielectric 220 and is removed as a part of the gate replacement process, but the gate dielectric 220 remains and will serve as the gate dielectric to the HKMG structure.

Figure 3:
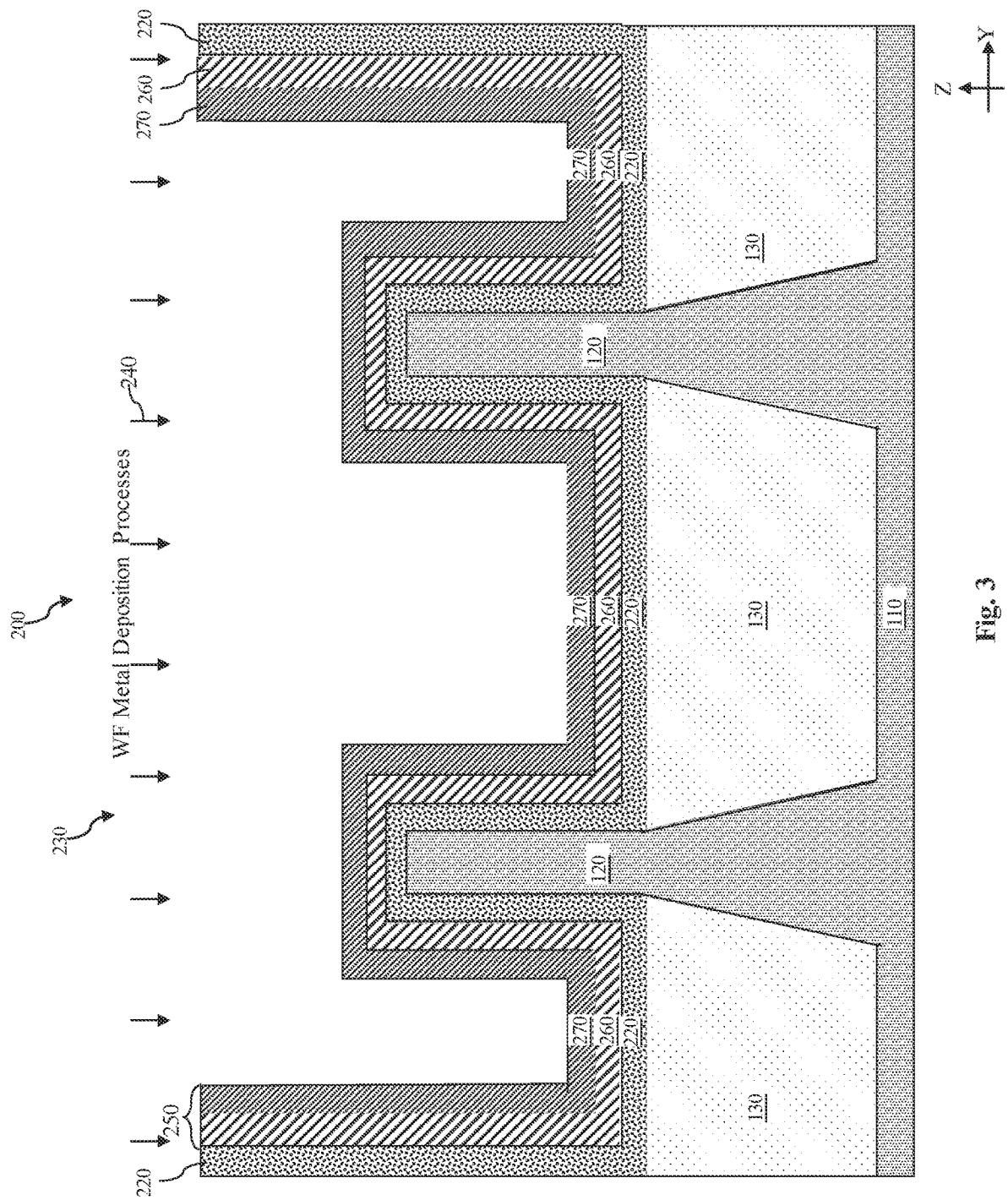

Referring now to FIG. 3, one or more work function (WF) metal deposition processes 240 are performed to the IC device 200 to form a WF metal structure 250 within the opening 230. In some embodiments, each of the WF metal deposition processes 240 may include an atomic layer deposition (ALD) process, a plasma enhanced atomic layer deposition (PEALD) process, a chemical vapor deposition (CVD) process, or a physical vapor deposition (PVD) process, or combinations thereof. The WF metal structure 250 may include a plurality of WF metal layers. For reasons of simplicity, two of such WF metal layers 260 and 270 are shown in FIG. 3, but it is understood that other numbers (e.g., 3, 4, etc.) of WF metal layers are possible.

In the embodiment shown in FIG. 3, the WF metal layer 260 is deposited onto the upper and side surfaces of the gate dielectric 220, and the WF metal layer 270 is deposited onto the upper and side surfaces of the WF metal layer 260. The work function metal layers 260 and 270 may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof.

Figure 4:
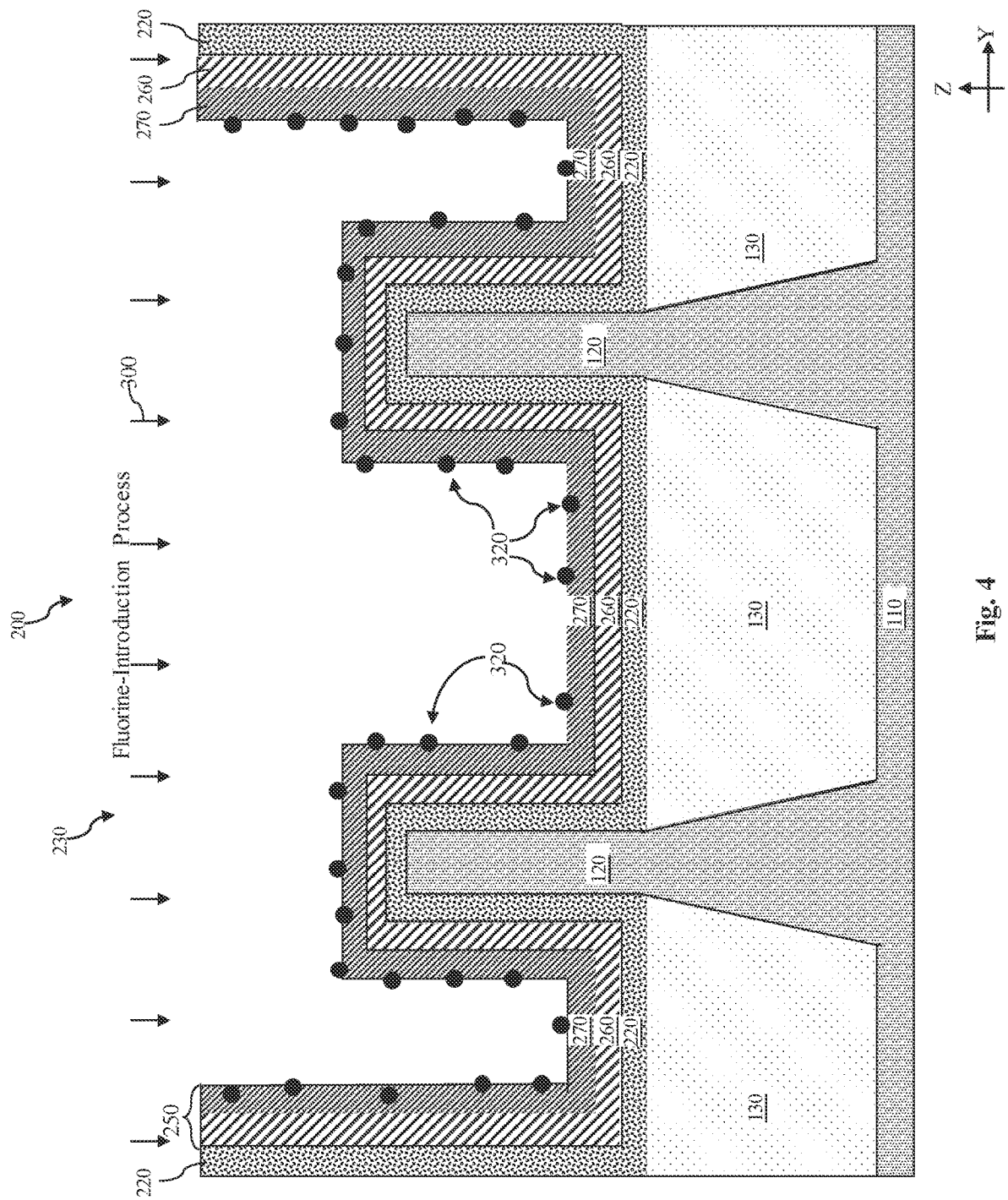

Referring now to FIG. 4, a fluorine-introduction process 300 is performed to the IC device 200 to introduce fluorine to the IC device 200. In some embodiments, the fluorine-introduction process 300 includes an implantation process to implant fluorine-containing particles 320 to the IC device 200, for example at least partially into the WF metal structure 250. In other embodiments, the fluorine-introduction process 300 includes a fluorine-containing gas treatment, which is also referred to as a fluorine gas soaking process. In such a gas treatment process, a gas is applied to the IC device 200, where the gas contains fluorine and another type of material bonded to fluorine, such as a nitride material. When reacting or encountering the WF metal layers 270 and/or 260 of the WF metal structure 250, the fluorine in the gas easily breaks its bond with the other type of material (e.g., nitride) and bonds with the materials in the WF metal layers 270 and/or 260 instead. As a result, fluorine-containing particles 320 may be introduced to the WF metal structure 250.

It is understood that although FIG. 4 mostly illustrates the fluorine-containing particles 320 being introduced at or near the surface of the WF metal layer 270, such an illustration is not intended to be limiting. In actual implementation of the fluorine-introduction process 300, the fluorine-containing particles 320 may be implanted (or otherwise introduced) further (e.g., deeper) into the WF metal layer 270, the WF metal layer 260, or even into the gate dielectric 220. However, regardless of how far or deep the fluorine-containing particles 320 may actually reach, it is understood that the fluorine concentration level at the gate dielectric 220 has not reached its optimal level at this stage of fabrication. For example, a fluorine concentration level within the gate dielectric 220 (even if it is greater than 0, meaning that some of the fluorine-containing particles have been introduced to the gate dielectric 220) at this stage of fabrication is still lower than a fluorine concentration level within the WF metal layer 270 or within the WF metal layer 260.

It is also understood that although the present disclosure illustrates an embodiment where the fluorine introduction process 300 is performed after two WF metal layers 260-270 have been formed, it may be performed just after the formation of one WF metal layer 260 as well. In other words, in some alternative embodiments, the WF metal layer 260 is formed over the gate dielectric 220, and then the fluorine introduction process 300 (or a similar process) is performed, and then the WF metal layer 270 may be formed.

Figure 5:
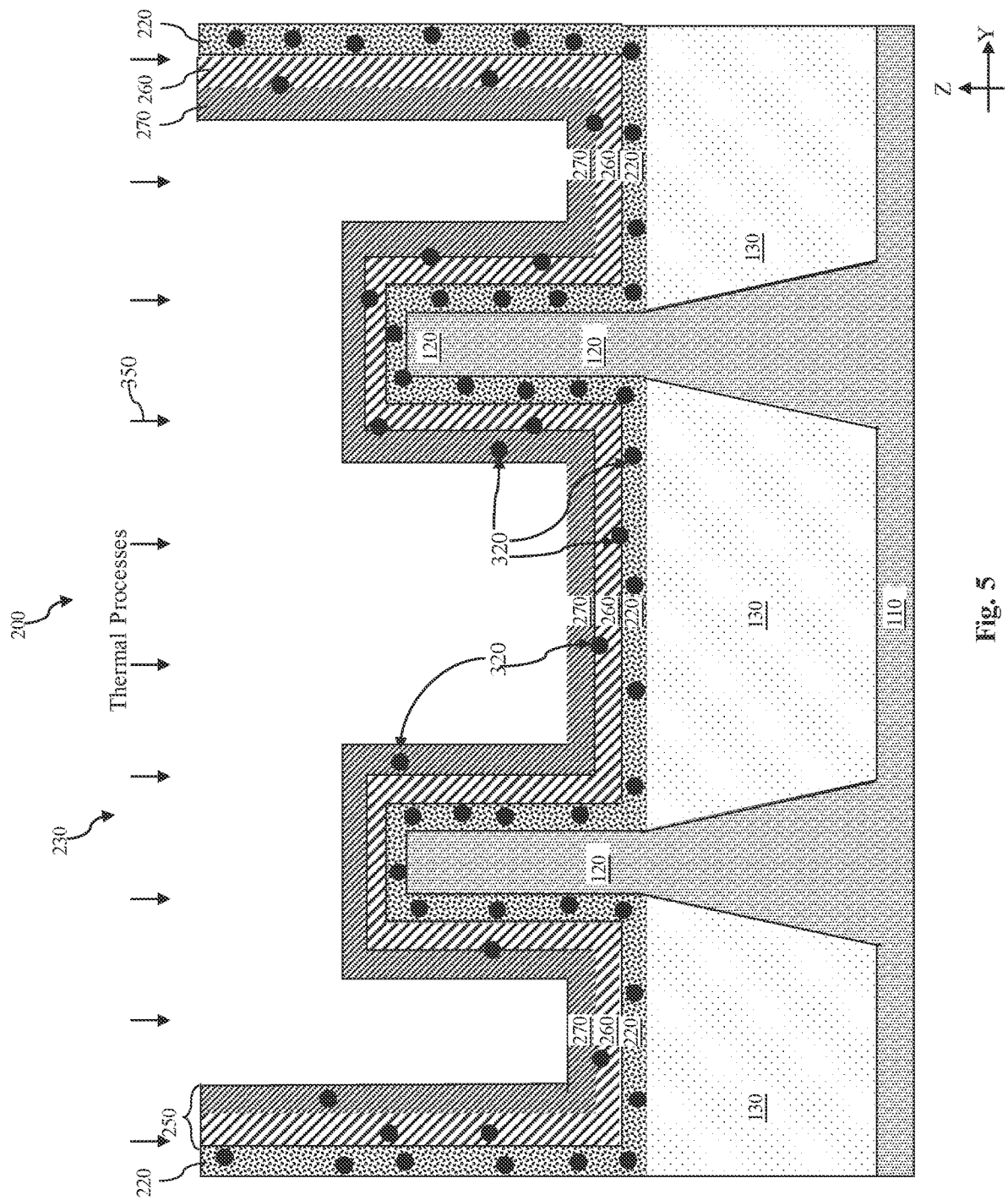

Referring now to FIG. 5, one or more thermal processes 350 may be performed to the IC device 200 to further drive the fluorine-containing particles 320 into the gate dielectric 220, so as to raise the fluorine-concentration level within the gate dielectric 220. In more detail, the thermal processes 350 may provide an energy boost to the fluorine-containing particles, which helps them to migrate or diffuse deeper into the gate dielectric 220 from the WF metal structure 250. As discussed above, the fluorine-containing particles 320 within the gate dielectric 220 may bond with the traps or defects associated with the amorphous grains within the gate dielectric 220, thereby alleviating potential current leakage problems caused by such defects or traps. This helps improve the performance and reliability of the IC device 200, as well as prolonging its lifetime.

In some embodiments, the one or more thermal processes 350 may include annealing processes, which may be performed with a temperature in a range between about 250 degrees Celsius and about 650 degrees Celsius, and with a duration between about 10 seconds and about 300 seconds. In some embodiments, the one or more thermal processes 350 are extra processes that are not performed in conventional fabrication processing, but that are specifically performed herein to help drive the fluorine-containing particles 320 into the gate dielectric 220. In other embodiments, the one or more thermal processes 350 may include thermal processes (such as annealing processes) that are performed as a part of a regular fabrication process flow. For example, middle-end or back-end of line (e.g., formation of metal interconnects and/or vias/contacts) fabrication processes often involves one or more thermal processes such as annealing. These "regular" thermal processes may be tuned in a manner such that their temperature and/or duration not only achieves their normal objectives, but they also help to provide the energy boost needed to drive the fluorine-containing particles further into the gate dielectric 220.

Regardless of how the one or more thermal processes 350 are performed, the end result is that the fluorine concentration level within the gate dielectric 220 is raised substantially. According to various aspects of the present disclosure, the average fluorine concentration level within the gate dielectric 220 (e.g., as a ratio of fluorine versus the metal elements in the gate dielectric 220) is within a range between about 0.5% and about 5%. The fluorine concentration level within the gate dielectric 220 is also substantially greater than the fluorine concentration level within the WF metal layer 260 or within the WF metal layer 270 at this stage of fabrication. For example, after the one or more thermal processes 350 are performed, the gate dielectric 220 may have a first average fluorine concentration level, the WF metal layer 260 may have a second average fluorine concentration level, and the WF metal layer 270 may have a third average fluorine concentration level, where the first average fluorine concentration level is substantially greater than the second average fluorine concentration level and the third average fluorine concentration level. In some embodiments, a ratio between the second average fluorine concentration level and the first average fluorine concentration level is in a range between about 15% and about 50%, and a ratio between the third average fluorine concentration level and the first average fluorine concentration level is in a range between about 5% and about 20%.

Note that these ranges and ratios discussed above are not randomly chosen but rather are specifically configured to optimize the performance of the gate dielectric. For example, as the one or more thermal processes 350 are performed with a greater temperature and/or a longer duration, that would result in more fluorine-containing particles 320 being driven into the gate dielectric 220 from the WF metal structure 250, thereby raising the ratio between the first average fluorine concentration level and the second/third fluorine concentration levels discussed above. However, while a greater concentration of fluorine within the gate dielectric 220 could potentially improve its performance (e.g., by bonding with more traps or defects associated with amorphous grains), it may reach a point of diminishing returns after a certain fluorine concentration level. Meanwhile, the greater temperature and/or time duration used to perform the thermal processes may prolong fabrication, raise fabrication costs, and/or cause damages to the IC device 200 potentially.

On the other hand, if the one or more thermal processes 350 are performed with a lower temperature and/or a shorter duration, that would result in fewer fluorine-containing particles 320 being driven into the gate dielectric 220 from the WF metal structure 250, thereby reducing the ratio between the first average fluorine concentration level and the second/third fluorine concentration levels discussed above. At some point, the fluorine concentration within the gate dielectric 220 may not be sufficiently high to serve its function of neutralizing or eliminating the traps or defects associated with the amorphous grains, which would defeat the purpose of the present disclosure.

For these reasons discussed above, it can be seen that a ratio that is too high or too low between the first average fluorine concentration level and the second/third fluorine concentration levels would be undesirable. Instead, such a ratio should be tuned to be within an optimal range, where the fluorine concentration level within the gate dielectric 220 is sufficiently high to neutralize or eliminate the traps or defects associated with the amorphous grains, but not too high so as to lead to fabrication processing difficulties and/or cause other potential defects.

Figure 6:
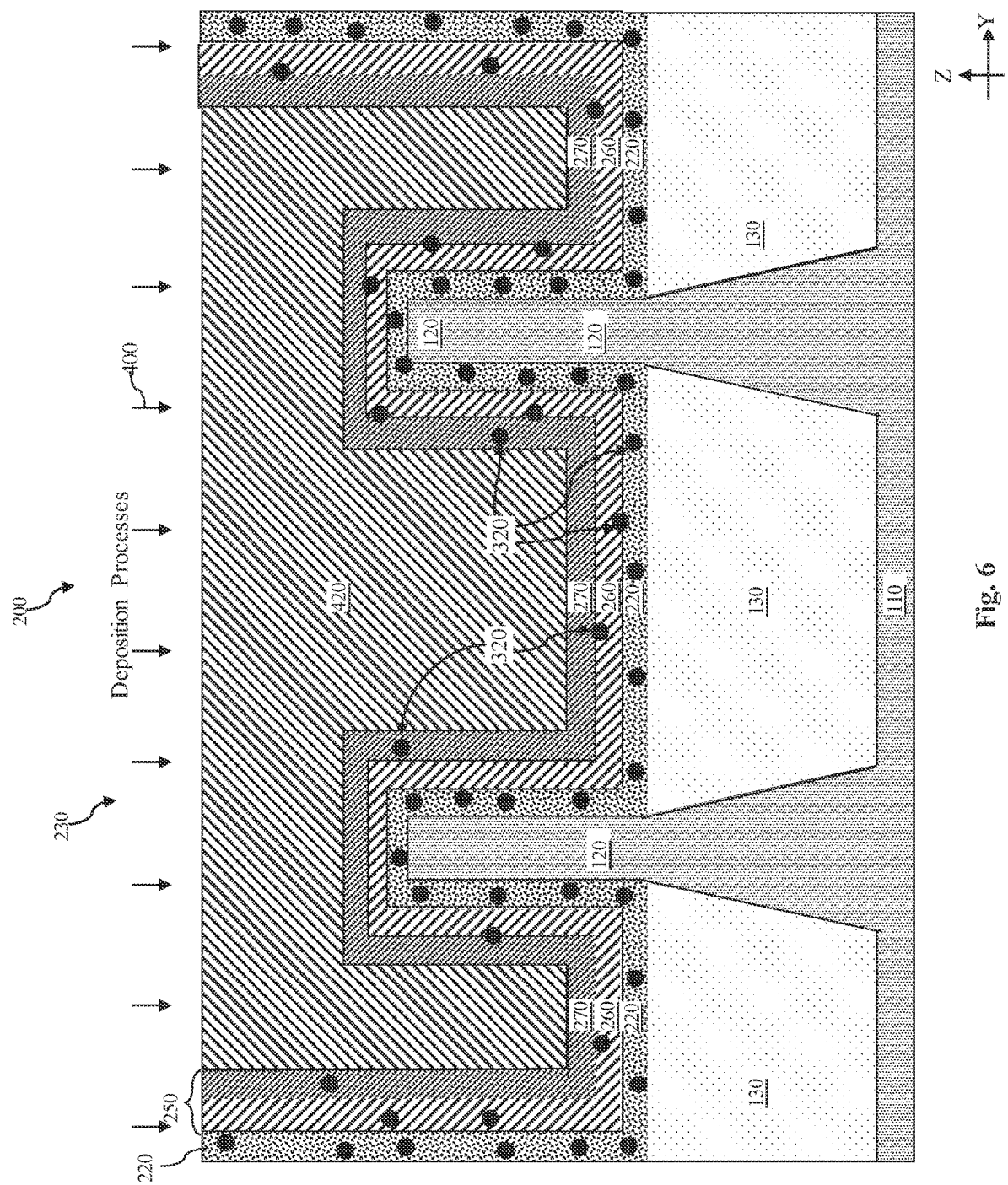

Referring now to FIG. 6, one or more deposition processes 400 may be performed to form a fill metal portion 420 of the gate electrode of the IC device 200. The deposition processes 400 may include ALD, CVD, PVD processes, or combinations thereof. The deposition processes 400 deposit the fill metal portion 420 onto the upper and side surfaces of the topmost WF metal layer, which in this embodiment is the WF metal layer 270. In some embodiments, the fill metal portion 420 includes a conductive metal material, such as cobalt, tungsten, copper, aluminum, or alloys or combinations thereof. The fill metal portion 420 may serve as a main conductive portion of the gate electrode.

It is understood that, the HKMG structure may include additional layers, such as interfacial layers, capping layers, diffusion/barrier layers, or other applicable layers. For reasons of simplicity, these additional layers are not specifically illustrated in the figures herein.

FIGS. 7A, 7B, 7C provide visual illustrations of how the fluorine concentration level varies as a function of depth within the IC device 200 at different stages of fabrication. For example, FIGS. 7A, 7B, and 7C illustrate a graph 700, a graph 710, and a graph 720, respectively. The graphs 700-720 each include an X-axis that represents the fluorine concentration level and a Y-axis that represents the depth of (or vertical position within) the IC device 200. To aid in the understanding of the graphs 710-720, the graphs 710-720 are also each broken down into four different regions that correspond to the location/depth of the WF metal layer 270, the location/depth of the WF metal layer 260, the location/depth of the gate dielectric, and the location/depth of the channel region 120. As such, the graphs 710-720 clearly illustrate how the fluorine concentration level varies across the different illustrated regions of the IC device 200 at different stages of fabrication.

In more detail, FIG. 7A corresponds to a stage of fabrication where the fluorine introduction has just occurred, but no thermal process or other energy boosting process has been performed to drive the fluorine further into the gate dielectric 220 yet. In some embodiments, FIG. 7A corresponds to the stage of fabrication shown in FIG. 4 but before FIG. 5. As illustrated by the graph 700, the fluorine concentration level starts off relatively high within the WF metal layer 270 (i.e., when the depth within the IC device 200 is shallow). This is because the fluorine introduction process 300 introduces more fluorine to the WF metal layer 270 than the other layers below (since the WF metal layer 270 effectively "blocks" the fluorine). A peak 730 of the fluorine concentration level remains at or within the WF metal layer 270 at this stage fabrication. The fluorine concentration level gradually declines into the WF metal layer 260, the gate dielectric 220, and the channel region (e.g., a portion of the fin structure disposed below, and being wrapped around by, the HKMG structure). As the depth increases within the channel region, the fluorine concentration level eventually approaches zero.

FIG. 7B corresponds to a stage of fabrication where the fluorine introduction has already occurred, and one or more thermal processes or other energy boosting processes are also being performed to begin driving the fluorine toward the gate dielectric 220. In some embodiments, FIG. 7B corresponds to the stage of fabrication at some time during the middle of the stage shown in FIG. 5, but before the thermal processes 350 have been completed. As illustrated by the graph 710, the fluorine concentration level starts off very low at the upper surface of the WF metal layer 270, and it rises gradually as the depth within the IC device 200 increases (e.g., deeper toward the channel region). The fluorine concentration level reaches a peak 740 somewhere within the WF metal layer 260, after which it begins to decline as the depth further increases. The decline of the fluorine concentration level continues within the gate dielectric 220 and the channel region, until it approaches zero. The graph 710 indicates that as the thermal processes 350 are being performed, fluorine is being driven or being diffused downwards from the WF metal layer 270 into the gate dielectric 220. However, the optimal fluorine concentration level within the gate dielectric 220 has not been reached yet, since the peak fluorine concentration level still does not occur within the gate dielectric 220.

FIG. 7C corresponds to a stage of fabrication where the one or more thermal processes or other energy boosting processes have been completed, and the optimal fluorine concentration level within the gate dielectric 220 has been reached. In some embodiments, FIG. 7C corresponds to the stage of fabrication after the thermal processes 350 in FIG. 5 have been completed, or at a stage of fabrication after the formation of the fill metal portion 420 of the metal gate electrode. As illustrated by the graph 720, the fluorine concentration level starts off very low at the upper surface of the WF metal layer 270, and it rises gradually as the depth within the IC device 200 increases (e.g., deeper toward the channel region). The fluorine concentration level reaches a peak 750 somewhere within the gate dielectric 220, after which it begins to decline as the depth further increases. The decline of the fluorine concentration level continues within the gate dielectric 220 and the channel region, until it approaches zero. The graph 720 indicates that after the thermal processes 350 have been completed, the optimal fluorine concentration level within the gate dielectric 220 has been reached, which offers the best performance improvement without potentially causing damage to other parts of the IC device 200.

As discussed above, one of the unique aspects of the present disclosure is that it introduces fluorine into the IC device 200 after the WF metal layers 260-270 have been formed. As such, some amounts of fluorine will still remain in the WF metal layers 260-270, which is detectable on sample devices using machine analysis. This would not have been possible had the fluorine introduction occurred prior to the formation of the WF metal layers, in which case the presence of fluorine in the WF metal layers would have been much lower, for example approaching zero. As such, the fluorine concentration level profile (corresponding to graph 720 shown in FIG. 7C) is one of the unique physical device characteristics of the IC devices fabricated according to the process flow of the present disclosure.

It is understood that the IC device 200 may be implemented in a variety of IC applications, including memory devices such as Static Random-Access Memory (SRAM) devices. In that regard, FIG. 8 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

FIG. 9 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such the processing tools to introduce fluorine to the IC device or to perform the thermal processes to cause the fluorine to diffuse further into the gate dielectric; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 10 is a flowchart illustrating a method 1000 of fabricating a semiconductor device. The method 1000 includes a step 1010 to form a fin structure or a stack of nano-structures that protrudes vertically out of a substrate as the channel structure of a FinFET or a gate-all-around (GAA) device.

The method 1000 includes a step 1020 to form a gate dielectric structure over the channel structure. In some embodiments, the forming the gate dielectric structure comprises forming a gate dielectric material that has a dielectric constant greater than a dielectric constant of silicon oxide.

The method 1000 includes a step 1030 to form one or more work function (WF) metal layers of a metal gate over the gate dielectric structure.

The method 1000 includes a step 1040 to treat the one or more WF metal layers with a fluorine-containing material.

In some embodiments, the treating comprises implanting fluorine at least partially into the one or more WF metal layers. In some embodiments, the treating comprises performing a fluorine-containing gas soaking process. In some embodiments, the fluorine-containing gas soaking process comprises a gas that contains both fluorine and a nitride material. In some embodiments, the treating and the one or more processes are performed such that the fluorine is diffused into both the gate dielectric structure and the one or more WF metal layers. In some embodiments, the treating and the one or more processes are performed such that a peak concentration level of the fluorine occurs within the gate dielectric structure.

The method 1000 includes a step 1050 to perform one or more processes to cause fluorine from the fluorine-containing material to diffuse at least partially into the gate dielectric structure. In some embodiments, the performing the one or more processes comprises performing an annealing process.

It is understood that additional steps may be performed before, during, or after the steps 1010-1050. For example, the method 1000 may include a step of forming a fin structure that protrudes vertically out of a substrate as the channel structure of a FinFET device before the gate dielectric structure is formed. In some embodiments, the method 1000 may include a step of forming nano-structure as the channel structure of a gate-all-around (GAA) device before the gate dielectric structure is formed. The method 1000 may also include the formation of conductive contacts and vias, interconnect lines, packaging, and testing processes. For reasons of simplicity, these additional steps are not discussed in detail herein.

In summary, the present disclosure involves introducing fluorine to an IC device after the formation of WF metals. The fluorine may first be introduced mostly within the WF metal layers. Thereafter, thermal processes or other energy boosting processes may be performed to provide the energy needed to drive the fluorine further downwards into a high-k gate dielectric, until an optimal amount of fluorine concentration level has been reached within the gate dielectric.

The unique fabrication process flow of the present disclosure offers advantages over conventional devices. It is understood, however, that no particular advantage is required, other embodiments may offer different advantages, and that not all advantages are necessarily disclosed herein. One advantage is the improvement in performance and reliability of IC devices. For example, the fluorine introduced into the gate dielectric can bond with the traps or defects associated with the amorphous grains of the gate dielectric, thereby neutralizing or eliminating the traps or defects. As a result, current leakage may be reduced, and this not only improves the performance of the IC device, but also the reliability and the lifetime of the IC device. Another advantage is attributed to the unique sequence in which the processing steps are performed, for example, the order in which the WF metal layers are formed and the fluorine introduction occurs. Had the fluorine been introduced to the high-k gate dielectric before the WF metal layers are formed, the weak bonding of fluorine with the materials of the high-k gate dielectric may easily break, causing the fluorine to escape from the high-k gate dielectric, which would have been undesirable. Here, since the fluorine is introduced after the formation of the WF metal layers, the fluorine will be better trapped within the high-k gate dielectric and will not be able to escape easily. Consequently, device performance is improved. Other advantages may include ease of fabrication and compatibility with existing fabrication processes.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

One aspect of the present disclosure involves a method. According to the method, a gate dielectric structure is formed over a channel structure. One or more work function (WF) metal layers of a metal gate are formed over the gate dielectric structure. The one or more WF metal layers are treated with a fluorine-containing material. One or more processes are performed to cause fluorine from the fluorine-containing material to diffuse at least partially into the gate dielectric structure.

Another aspect of the present disclosure involves a method. According to the method, a gate dielectric of a gate structure is formed over a channel of a FinFET device or a gate-all-around (GAA) device. A work function (WF) metal of a gate electrode of the gate structure is formed over the gate dielectric. After the WF metal has been formed, fluorine is introduced to the gate dielectric via one or more fluorine treatment processes and one or more thermal processes, such that a peak concentration of fluorine within the gate structure occurs within the gate dielectric.

Yet another aspect of the present disclosure involves a device. The device includes a gate dielectric of a transistor disposed over a channel of the transistor. The device includes a work function (WF) metal of a gate electrode of the transistor disposed over the gate dielectric. The device includes a fill metal of the gate electrode disposed over the WF metal. The WF function metal has a first concentration of fluorine. The gate dielectric has a second concentration of fluorine. The second concentration is substantially greater than the first concentration.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
   forming a gate dielectric structure over a channel structure;
   forming one or more work function (WF) metal layers of a metal gate over the gate dielectric structure;
   treating the one or more WF metal layers with a fluorine-containing material, wherein the fluorine-containing material further contains a nitride material; and performing one or more processes to cause fluorine from the fluorine-containing material to diffuse at least partially into the gate dielectric structure.

2. The method of claim 1, wherein the treating comprises implanting fluorine at least partially into the one or more WF metal layers.

3. The method of claim 1, wherein the treating comprises performing a fluorine-containing gas soaking process.

4. The method of claim 1, further comprising: after the treating or after the performing the one or more processes, forming an additional WF metal layer over the treated one or more WF metal layers.

5. The method of claim 1, wherein the performing the one or more processes comprises performing an annealing process.

6. The method of claim 1, wherein the treating and the one or more processes are performed such that the fluorine is diffused into both the gate dielectric structure and the one or more WF metal layers.

7. The method of claim 6, wherein the treating and the one or more processes are performed such that a peak concentration level of the fluorine occurs within the gate dielectric structure.

8. The method of claim 1, further comprising: before the forming the gate dielectric structure, forming a fin structure that protrudes vertically out of a substrate as the channel structure of a FinFET device.

9. The method of claim 1, further comprising: before the forming the gate dielectric structure, forming nano-structure as the channel structure of a gate-all-around (GAA) device.

10. The method of claim 1, wherein the forming the gate dielectric structure comprises forming a gate dielectric material that has a dielectric constant greater than a dielectric constant of silicon oxide.

11. A method, comprising:
forming a gate dielectric of a gate structure over a channel of a FinFET device or a gate-all-around (GAA) device;
forming a first work function (WF) metal of a gate electrode of the gate structure over the gate dielectric;
after the first WF metal has been formed, introducing fluorine to the gate dielectric via one or more fluorine treatment processes and one or more thermal processes, such that a peak concentration of fluorine within the gate structure occurs within the gate dielectric; and
after the introducing of the fluorine, forming a second WF metal over the first WF metal.

12. The method of claim 11, wherein the introducing the fluorine comprises:
introducing a fluorine-containing material to the WF metal via the one or more fluorine treatment processes; and
driving fluorine particles from the fluorine-containing material from the WF metal into the gate dielectric via the one or more thermal processes.

13. The method of claim 12, wherein the one or more fluorine treatment processes comprises implanting fluorine into the WF metal or a fluorine gas soaking process.

14. The method of claim 12, wherein the one or more fluorine treatment processes are performed at least in part using a gas that contains both fluorine and a nitride material.

15. A device, comprising:
a gate dielectric of a transistor disposed over a channel of the transistor;
a work function (WF) metal of a gate electrode of the transistor disposed over the gate dielectric; and
a fill metal of the gate electrode disposed over the WF metal;
wherein:
the WF metal has a first concentration of fluorine;
the gate dielectric has a second concentration of fluorine;
the second concentration is substantially greater than the first concentration; and
a concentration of fluorine at a bottom surface of the WF metal is greater than a concentration of fluorine at a bottom surface of the gate dielectric.

16. The device of claim 15, wherein the fill metal is substantially devoid of fluorine.

17. The device of claim 15, wherein a concentration level of fluorine within the WF function metal and the gate dielectric varies as a function of depth.

18. The device of claim 17, wherein the concentration level of fluorine rises as depth increases, until a peak is reached within the gate dielectric, after which the concentration level of fluorine decreases as depth increases.

19. The device of claim 15, wherein the channel contains fluorine but at a lower concentration level than the gate dielectric and the WF metal.

20. The device of claim 15, wherein the transistor is a FinFET or a gate-all-around (GAA) device.

* * * * *